United States Patent
Ring et al.

(10) Patent No.: US 11,287,492 B2
(45) Date of Patent: Mar. 29, 2022

(54) MAGNETIC PIG POSITIONING SYSTEM AND METHOD

(71) Applicant: NOV PROCESS & FLOW TECHNOLOGIES AS, Fornebu (NO)

(72) Inventors: Karl Frode Ring, Oslo (NO); Artsiom Stalmakou, Hønefoss (NO)

(73) Assignee: NOV PROCESS & FLOW TECHNOLOGIES AS, Fornebu (NO)

( * ) Notice: Subject to any disclaimer, the term of this patent is extended or adjusted under 35 U.S.C. 154(b) by 0 days.

(21) Appl. No.: 17/085,501

(22) Filed: Oct. 30, 2020

(65) Prior Publication Data

US 2021/0132162 A1 May 6, 2021

(30) Foreign Application Priority Data

Nov. 4, 2019 (EP) .................................... 19206928

(51) Int. Cl.
*G01R 33/10* (2006.01)
*G01R 33/02* (2006.01)
(Continued)

(52) U.S. Cl.
CPC ......... *G01R 33/10* (2013.01); *G01R 33/0206* (2013.01); *G01D 5/142* (2013.01); *G01R 33/0094* (2013.01)

(58) Field of Classification Search
CPC .......................... G01R 33/00; G01R 33/0035; G01R 33/0023; G01R 33/0017; G01R 31/3191;
(Continued)

(56) References Cited

U.S. PATENT DOCUMENTS

| 2004/0211443 | A1* | 10/2004 | Latiolais, Jr. ........... | F16L 55/48 134/8 |
| 2009/0013806 | A1* | 1/2009 | Miller ..................... | F16L 55/48 73/865.8 |
| 2015/0081246 | A1* | 3/2015 | Schaaf .................. | G01D 5/145 702/150 |

FOREIGN PATENT DOCUMENTS

| EP | 1 452 827 | 9/2004 |
| JP | 2001-235089 | 8/2001 |

(Continued)

OTHER PUBLICATIONS

Extended European Search Report dated Oct. 12, 2020 in European Application No. 19206928.4.

*Primary Examiner* — Patrick Assouad
*Assistant Examiner* — Taqi R Nasir
(74) *Attorney, Agent, or Firm* — Wenderoth, Lind & Ponack, L.L.P.

(57) ABSTRACT

A system for determining the position of a pig located inside a pipe including a magnetic field source attached to the pig; at least one magnetic field sensor provided on the outside of the pipe and configured to measure magnetic field parameters; and a processor configured to receive magnetic field parameters from the at least one magnetic field sensor and computing a position of the magnetic field source relative to a given reference position. The method includes: establishing a magnetic field representation of the magnetic field provided by the magnetic field source; in-situ measuring at least two magnetic field parameters outside the pipe with a magnetic field sensor at a measuring position relative to the reference position; computing the source position of the magnetic field source relative to the reference position based on data comprising the in-situ measured magnetic field parameters and the magnetic field representation.

14 Claims, 7 Drawing Sheets

(51) Int. Cl.
*G01D 5/14* (2006.01)
*G01R 33/00* (2006.01)

(58) Field of Classification Search
CPC .......................... G01R 33/10; G01R 33/0206; G01R 33/0094; G01B 7/004; G01C 17/38; G06F 3/017; G06F 3/0346; G06F 3/012; G01D 5/142
See application file for complete search history.

(56) References Cited

FOREIGN PATENT DOCUMENTS

| | | | | | |
|---|---|---|---|---|---|
| JP | 2001235089 | A | * | 8/2001 | .............. F16L 55/26 |
| WO | 02/086423 | | | 10/2002 | |

* cited by examiner

MAGNETIC PIG POSITIONING SYSTEM AND METHOD

TECHNICAL FIELD

The invention generally relates to pigging of pipes associated with production and transportation of hydrocarbons, and in particular to the positioning of pipeline inspection gauges for use in such operations.

BACKGROUND OF THE INVENTION

Related to production and transportation of hydrocarbons, there is extensive use of pipes, both for unprocessed well stream (in the following referred to as flow lines), and for sales quality fluids (in the following referred to as trunk lines). For flow lines there may be a need for frequent pigging or removal of wax and liquid slugs. A purpose designed device, referred to as Pipeline Inspection Gauge (PIG), is pushed through the flowline or trunk line by the well stream or production fluid to clean out wax or slugs.

A pig may be any movable pipe tool which e.g. can be used for physical separation of fluids in a pipeline, internal cleaning of pipelines, inspection of pipelines, and recording geometric information of pipelines.

Pigs tend to get stuck in restrictions in the pipeline, such as valves and junctions, in worst case resulting in production stop. For such cases, exact location of the pig may be vital in resolving the problem. Knowledge of exact location of pigs may also be of significance for pig launching units, especially for automation of the pig launch process. It is also beneficial to be able to determine the position of the pig when used for inspection purposes, such that defects can be easily mapped in order to aid repair crews in maintenance.

Several pig passage detector systems have been proposed, e.g. magnet-based, nucleonic and acoustic techniques. Nucleonic devices are well suited for position measurement but are associated with HSE issues and thus operational constraints and cost. HSE issues are to a large extend avoided when using acoustic and magnet-based techniques.

However, due to their sensitivity to external distortions these systems have proven unreliable. One example of a magnet-based pig position detector is disclosed in EP1452827.

Current magnetic pig detection systems are based on detecting passage of a moving magnetic field, specifically by detecting changes in the magnetic field strength. This is a binary detection approach, i.e. pig pass/no pass within the vicinity of the sensor, which requires a movement (passage) of the pig for successful passage detection.

Magnetic fields may be detected by several methods, e.g. Hall Effect magnetometers and magnetoresistive sensors. Unless structurally combined, they only detect one component of the magnetic field, which is sufficient for many applications, e.g. wheel speed sensors, proximity sensors and crankshaft position sensors.

Many trunk lines and flowlines are fabricated from carbon steel qualities of low cost, such as X65. Carbon steel pipe tends to absorb and distort a magnetic field substantially and retain the effects of magnetization by magnets for a period of time, especially in cases where an In-Line Inspection tool (ILI tool) has been used.

When running the pig-type referred to as ILI tool, permanent magnets provided on the tool sends magnetic flux into the pipe walls for leak, corrosion and flaw detection, the pipe material is thus strongly magnetized. This magnetization causes significant distortion on magnet-based detection systems.

Large pipe components, such as valves and junctions as well as pipe welds further reduce and disturb magnetic fields.

Further distortions are caused by the natural magnetic field of the earth.

A common method for calculating a linear position f(x,y) of a single magnet is to first compute the angle $\theta$ of the magnetic field, e.g. by use of the trigonometric function arctan(y/x). The angle $\theta$ is measured with reference to the north-south orientation of the magnet. The linear position may then be obtained by approximating the position by using a linear function such as $$f(x,y)=S\cdot\theta(x,y)$$

wherein S is a scalar (with units as appropriate). This method gives a good estimate of the linear position of a magnet when the magnet is close to the sensor, i.e. when the angle $\theta$ is close to 0, in which limited range the arctan function of $\theta$ has a linear behavior.

When the magnet is displaced from the sensor, its linear position calculated with the arctan function will deviate exponentially from its true position. Thus, this method doesn't provide reliable approximations of pig positions unless the pig is aligned with the sensor.

To increase the range of reliability, several sensors are used in an array. This is undesirable for pig position measurement in pipes, as the size of the sensor will greatly increase. Available space for installation of such sensors are very often limited, especially for subsea applications where sensor housing and electrical connectors are designed to withstand long term ambient water pressure and potential leakages.

The measurement range provided by the (near) linear part of the arctan function of $\theta$ is not suitable for accurate position measurement of a pig within a steel pipe, giving a reliable range of only a few centimeters. This is particularly evident when measuring the position of a magnet located within a steel pipe, where the magnetic field is distorted by the pipe, i.e. the magnetic field is both reduced and diverted by the pipe material.

An objective of the present invention is to provide a system which solves the identified problem without the above-mentioned disadvantages. In particular a method, program and system which increases the measurement range and accuracy of a magnet-based pig positioner and has a reduced sensitivity to magnetic distortions, such as the above-mentioned distortion.

SUMMARY OF THE INVENTION

The invention relates to a method, a computer program and a system for determining the position of a pig located inside a pipe as set forth in the independent claims. Preferred embodiments are set forth in the dependent claims.

It is disclosed a method for determining the position of a pig located inside a pipe, using a system comprising: a magnetic field source attached to the pig; at least one magnetic field sensor provided on the outside of the pipe and configured to measure magnetic field parameters; and a processor configured to receive magnetic field parameters from the at least one magnetic field sensor and computing a position of the magnetic field source relative to a given reference position.

Wherein the method comprises the steps of: establishing a magnetic field representation of the magnetic field provided by the magnetic field source; in-situ measuring at least two magnetic field parameters outside the pipe by means of the at least one magnetic field sensor at least at one given measuring position relative to the reference position; computing the position of the magnetic field source relative to the reference position based on data comprising the in-situ measured magnetic field parameters and the magnetic field representation of the magnetic field provided by the magnetic field source; and outputting data on the source position of the magnetic field source relative to the reference position.

The magnetic field representation encompasses inter alia: functions, regression calculation models, statically calculation models, math models, tables, and machine learning.

An advantage of the magnetic field representation is that it allows detection of the magnetic field source arranged on the pig to be less sensitive to magnetism that are not provided by the magnetic source. Magnetism that are not caused by the magnetic source is hereinafter referred to as background noise, including distortions.

A further advantage of the method is that it enables measurement of a pig's static position, as the function of the pig present static magnetic field at a given point in the magnetic field representation to give a reliable indication of a magnet's relative position.

A system and method for position detection of a pig inside a pipe without compromising the pressure containment system is achieved.

Further achieved is a system and method suitable for position detection of a pig inside a pipe located in a subsea environment, or on land, or at a pipe termination on a platform.

A system which quantifies the distance between the sensor and the source is achieved.

If two or more types of pigs are provided, each type of pig may be provided with a given type of magnetic field source, wherein the given type of magnetic field source provides a characteristic magnetic field. The method further comprises the steps of: establishing a register of types of pigs and corresponding characteristic magnetic fields; computing the type of pig based on data comprising the in-situ measured magnetic field parameters and the register of types of pigs and corresponding characteristic magnetic field; and outputting data on the type of pig.

It is thus achieved a way of identifying different types of pigs in the pipe.

Preferably, the magnetic field representation has been calibrated, i.e. compensated for the magnetic background noise. A magnetic field representation being compensated for magnetic background noise is advantageous for use in computing the position of the magnetic field source. It is further advantageous that also the in-situ measurements are calibrated, i.e. compensated for the magnetic background noise. By measuring or otherwise providing data on the magnetic background noise, such data may be included in the basis for computing the position of the magnetic field source.

An advantage of this method is that the in-situ calibration also can compensate for cases where the magnetic field source has strength variations over time. A further advantage of this method is its enhanced reliability regarding range and accuracy.

The magnetic field parameters may be vector components, e.g. magnitude and a direction angle or components in a coordinate system. Examples of coordinate systems are cartesian coordinate system, polar coordinate system, spherical coordinate system. The measuring position of the magnetic field sensor may coincide with the reference position.

The magnetic field representation of the magnetic field provided by the magnetic field source may be a magnetic field law model, e.g. a first principles model. A first principles model of the magnetic field is a theoretic model of how the magnetic field is expected to be based on known theory.

The step of establishing the magnetic field representation of the magnetic field provided by the magnetic field source may comprise the steps of: arranging the pipe at a given pipe position relative to the reference position; positioning the magnetic field source at a given source position relative to the reference position, wherein the source position is located inside the pipe; measuring at least two magnetic field parameters of the magnetic field provided by the magnetic field source by means of the at least one magnetic field sensor at a given measuring positions relative to the reference position, wherein the measuring position is located outside the pipe; storing the measured magnetic field parameters of the magnetic field provided by the magnetic field source and the corresponding measuring position relative to the reference position; repeating the preceding steps at least once either with the magnetic field source moved to at least one subsequent given source position or with the magnetic field sensor moved to at least one subsequent given measuring position; and establishing the magnetic field representation of the magnetic field provided by the magnetic field source based on the stored magnetic field parameters of the magnetic field provided by the magnetic field source and the corresponding measuring position relative to the reference position.

It is thus achieved a way of providing a magnetic field representation. To establish the magnetic field representation as representative as possible, the pipe preferably has similar or identical dimensions and material as the pipe in the field where in-situ measurements are to be taken.

The step of establishing the magnetic field representation of the magnetic field provided by the magnetic field source may further comprises the steps of: arranging the pipe at a given pipe position relative to the reference position; ensuring the magnetic field source is out of reach of the at least one magnetic field sensor; measuring two magnetic field parameters of a reference magnetic background noise by means of the at least one magnetic field sensor at least at one given measuring positions relative to the reference position, wherein the at least one given measuring positions is located outside the pipe; storing the measured magnetic field parameters of the reference magnetic background noise and the corresponding measuring position relative to the reference position; and calibrating the magnetic field representation of the magnetic field provided by the magnetic field source by compensating for the reference background noise, wherein the calibration is based on the stored magnetic field parameters of the reference magnetic background noise and the corresponding measuring position relative to the reference position.

By the phrase "out of reach", the skilled person will understand that the magnetic field source is not significantly influencing the at least one magnetic field sensor, e.g. ensuring the magnetic field is magnetically insulated, or not in proximity of the at least one magnetic field sensor.

It is thus achieved a calibrated magnetic field representation which will enable more accurate computing of the source position, i.e. the position of the magnetic field source.

The method may further comprise the step of in-situ calibrating the magnetic field parameters measured in-situ outside the pipe by means of the at least one magnetic field sensor at least at one given measuring position relative to the reference position, the in-situ calibration being performed prior to computing the position of the magnetic field source relative to the reference position; wherein the in-situ calibrating comprises the steps of: ensuring the magnetic field source is out of reach of the at least one magnetic field sensor; measuring two magnetic field parameters of in-situ magnetic background noise by means of the at least one magnetic field sensor at the at least one given measuring position relative to the reference position; storing the measured magnetic field parameters of in-situ magnetic background noise and their measuring positions relative to the reference position; and in-situ calibrating the magnetic field parameters measured in-situ outside the pipe by means of the at least one magnetic field sensor at least at one given measuring position relative to the reference position by compensating for the in-situ background noise, wherein the calibration is based on the stored magnetic field parameters of the in-situ magnetic background noise and their measuring positions relative to the reference position.

It is thus provided data which may be used to compensate for the magnetic background noise in the in-situ measurements. In-situ measurements compensating for magnetic background noise is advantageous for use in computing the position of the magnetic field source. In-situ measurements compensating for magnetic background noise is particularly advantageous when also the magnetic field representation is being compensated for magnetic background noise.

It is thus achieved a more accurate computation of the position of the magnetic field source.

The magnetic background noise may vary in different places due to local equipment magnetic variations, and due to the geographical magnetic field being different at various places on the Earth. Performing a calibration in-situ will compensate for:
- geographic position changes;
- orientation of the in-situ magnetic field sensor relative to the Earth magnetic poles; and
- other magnetic disturbances.

Hence, performing a calibration in-situ will increase the accuracy of the computation of the position of the magnetic field source.

The magnetic background noise may change if components in a system are removed, installed or replaced. Performing a calibration whenever the system changes will increase the accuracy of the computation of the position of the magnetic field source.

In-situ calibration or in-situ re-calibration may preferably be performed even when the system and geographic location are unchanged, preferably the initiation of each calibration is programable or remotely controllably. The initiation can for example be at set time intervals or programed to be performed after a pig has passed by the sensor or after a pig is launched, or programed to be done regularly, or be after instruction from an operator. The in-situ re-calibration may comprise the same steps as the in-situ calibration.

An advantage of this method is that the in-situ calibration also can compensate for cases where the magnetic field source has strength variations over time.

The parameters measured by the method are continuous parameters; hence, the computed values are also continuous.

The parameters may be measured within a defined distance range from the magnetic field source, preferably within +/−500 cm, or preferably within +/−200 cm, or preferably within +/−150 cm, or preferably within +/−15 cm. The computed values may preferably have an accuracy of +/−3.0 cm.

The method may further comprise the step of computing the velocity of the magnetic field source, wherein the computing of the velocity of the magnetic field source comprises the steps of: performing, at least two times at given points of time, the step of computing the position of the magnetic field source relative to the reference; computing the traveled distance of the magnetic field source based on the computed positions of the magnetic field source relative to the reference position; computing the velocity of the magnetic field source relative to the reference position based on the traveled distance and the given points of time; and outputting data on the velocity of the magnetic field source relative to the reference position.

The method may further comprises the step of computing the acceleration of the magnetic field source, wherein the computing of the acceleration of the magnetic field source comprises the steps of: computing, at least two times at given points of time, the velocity of the magnetic field source relative to the reference; computing the acceleration of the magnetic field source relative to the reference position based on the velocities and the given points of time; and outputting data on the velocity of the magnetic field source relative to the reference position.

It is disclosed a computer program comprising instructions which, when the program is executed by a computer, cause the computer to carry out at least parts of the mentioned method.

It is thus achieved a software which is interchangeable between different systems.

It is described a system for determining the position of a pig located inside a pipe, wherein the system comprises: a magnetic field source attachable to the pig; a magnetic field sensor deployable on the outside of the pipe and configured to measure magnetic field parameters; and a processor configured to receive magnetic field parameters from the magnetic field sensor; wherein the processor comprises means for computing the position of the magnetic field source relative to a reference position by performing at least parts of the mentioned method.

It is achieved a system with the same advantages as the mentioned methods.

The processor and the magnetic field sensor may be integrated in a portable sensor unit. The portable sensor unit may be a smartphone or tablet.

The portable sensor unit may comprise the mentioned computer program.

It is disclosed a method for determining the position of a pig located inside a pipe, using a system comprising: a magnetic field source attached to the pig, a magnetic field sensor provided on the outside of the pipe and configured to measure magnetic field data, and a processor configured to receive magnetic field data from the magnetic field sensor and computing a position of the magnetic field source relative to the position of the magnetic field sensor.

The method comprises the steps of: providing a magnetic field by means of the magnetic field source; measuring two parameters of the magnetic field by means of the magnetic field sensor; computing the position of the magnetic field source from the magnetic field parameters; and outputting data on the position of the magnetic field source relative to the position of the magnetic field sensor.

Alternatively, the processor may output data on the position of the magnetic field source relative to a predetermined reference position on the outside of the pipe. This reference position may differ from the position of the magnetic field sensor. If the reference position differs from the position of the magnetic field sensor, the position of the magnetic field sensor should be predetermined relative to the reference position, such that the processor can take this into account when computing the position of the magnetic field source.

Relevant parameters of the magnetic field may be amplitude and angle, or longitudinal and radial direction.

It may be used two or more magnetic field sensor devices when measuring the magnetic field parameters to be received by the processor. If several sensors are used, they may measure different parameters of the magnetic field which in combination form a data set suitable for computing a position of the magnetic field source.

The method may also comprises the steps of: measuring a radial component of the magnetic field at the position of the magnetic field sensor in a radial direction of the pipe: if the radial component of the magnetic field at the position of the magnetic field sensor is directed away from the pipe, the magnetic field sensor is north of a neutral line of the magnetic field source; if the radial component of the magnetic field at the position of the magnetic field sensor is directed towards the pipe, the magnetic field sensor is south of a neutral line of the magnetic field source; outputting the position of the magnetic field source relative to the magnetic field sensor. Said relative position may e.g. be identified as downstream/upstream the magnetic field sensor, or on the magnetic north/south side of the magnetic field source.

It is achieved a method for determining on which side of the magnetic field sensor the magnetic field source (i.e. the pig) is positioned.

The method may also comprises the steps of: obtaining a radial component of the magnetic field at the position of the magnetic field sensor in a radial direction of the pipe: if the radial component of the magnetic field at the position of the magnetic field sensor is about zero, the magnetic field source is aligned with the magnetic field sensor; and if the radial component of the magnetic field at the position of the magnetic field sensor is deviating from zero, the position of the magnetic field source is deviating from the magnetic field sensor; outputting the proximity of the magnetic field source relative to the magnetic field sensor.

It is achieved a system which determines if the magnetic field source is aligned with the magnetic field sensor.

The method may also comprise the steps of: computing a first principles model of the magnetic field provided by the magnetic field source; measuring a radial component of the magnetic field at the position of the magnetic field sensor in a radial direction of the pipe; measuring a longitudinal component of the magnetic field at the position of the magnetic field sensor in a longitudinal direction of the pipe; computing an approximate point in said first principles model of the magnetic field from the measured components and a given radial distance between the location of the magnetic field sensor and the magnetic field source; computing the longitudinal distance component of the distance between the location of the magnetic field sensor and a neutral line of the magnetic field source in a longitudinal direction of the pipe; outputting the longitudinal distance between the magnetic field source and the magnetic field sensor in a longitudinal direction of the pipe.

The method may also comprises the steps of: measuring a first radial component of the magnetic field at a first point in the magnetic field sensor in a radial direction of the pipe; measuring a first longitudinal component of the magnetic field at the first point of the magnetic field sensor in a longitudinal direction of the pipe; computing a first angle of the magnetic field at the first point of the magnetic field sensor relative to a longitudinal direction of the pipe; measuring a second radial component of the magnetic field at a second point in the magnetic field sensor in a radial direction of the pipe; measuring a second longitudinal component of the magnetic field at the second point of the magnetic field sensor in a longitudinal direction of the pipe; computing a second angle of the magnetic field at the second point of the magnetic field sensor relative to a longitudinal direction of the pipe; computing an approximate elliptic geometry of a magnetic field line from the first and second angles of the magnetic field and their relative distance; computing an approximate point on the periphery of said elliptic geometry in which the magnetic field sensor is located; computing the longitudinal distance component of the distance between the location of the magnetic field sensor and the center of said elliptic geometry in a longitudinal direction of the pipe; outputting the longitudinal distance between the magnetic field source and the magnetic field sensor in a longitudinal direction of the pipe.

It is achieved a system which determines the distance between the sensor and the source. An advantage of this method is that it doesn't require the system to have knowledge about the magnetic field source, as the system will compute a model of the magnetic field by itself.

The method may also comprises the steps of computing an angle of the magnetic field at the position of the magnetic field sensor relative to a longitudinal direction of the pipe; comparing the angle of the magnetic field with a set of data, in which the data comprises a register of angles and corresponding distance values; outputting the distance between the magnetic field source and the magnetic field sensor.

It is achieved a system which determines the distance between the sensor and the source. An advantage of this method is that the results are very reliable when the conditions are unchanged.

The method may also comprises the steps of: measuring the magnetic field provided by the magnetic field source; storing the magnetic field data provided by the magnetic field source; measuring the distorted magnetic field provided on the outside of the pipe by the magnetic field source located inside said pipe; storing the distorted magnetic field data provided on the outside of the pipe by the magnetic field source located inside said pipe; computing the distortional effect the pipe has on the magnetic field provided by the magnetic field source by comparison of said stored magnetic field data; storing pipe specific data and the corresponding distortional effect of the pipe on the provided magnetic field for use in future computing of the position of the magnetic field source relative to the magnetic field sensor.

It is achieved a method for determining the distortional effect a pipe has on the magnetic field of a magnetic field source located inside the pipe. To account for this distortion, when performing computations based on measured magnetic field data, a method of determining the distortional effect must firstly be available.

It is achieved a method which is less sensitive for distortions.

By means of this calibration method, it is achieved a method and a system which is interchangeable between pipes of different wall thickness and material.

The method may also comprise the steps of: measuring a longitudinal component of the magnetic background noise at the position of the magnetic field sensor in a longitudinal direction of the pipe, without the presence of the magnetic field source; measuring a radial component of the magnetic background noise at the position of the magnetic field sensor in a radial direction of the pipe, without the presence of the magnetic field source; storing the initial magnetic components for use in future computing of the position of the magnetic field source relative to the magnetic field sensor.

It is achieved a method for determining the magnetic background noise. To account for this distortion, when performing computations based on measured magnetic field data, a method of determining the magnetic background noise must firstly be available. An advantage of this method is that it provides the possibility of eliminating the magnetic back ground noise from the equation.

This calibration may be performed in-situ.

The magnetic background noise may vary in different places on the earth. Performing a calibration whenever the geographic position changes may reduce the effect of the background noise.

The magnetic background noise may change if components in a system are removed, installed or replaced. Performing a calibration whenever the system changes may reduce the effect of the background noise.

Calibration may preferably be performed even when the system and geographic location are unchanged, preferably at set time intervals.

This method may be advantageous if it is not possible to measure or otherwise obtain the magnetic field provided by the magnetic field source.

The method may further comprise the steps of: obtaining a longitudinal component of the actual magnetic field at the position of the magnetic field sensor in a longitudinal direction of the pipe, with the presence of the magnetic field source; computing a longitudinal component of the magnetic field provided by the magnetic field source by subtracting the stored longitudinal component of the magnetic background noise from said obtained longitudinal component of the actual magnetic field; obtaining a radial component of the actual magnetic field at the position of the magnetic field sensor in a radial direction of the pipe, with the presence of the magnetic field source; computing a radial component of the magnetic field provided by the magnetic field source by subtracting the stored radial component of the magnetic background noise from said obtained radial component of the actual magnetic field.

An advantage of this method is that it eliminates magnetic background noise from the equation for computing the position of the magnetic field source.

The method may also comprise the steps of: performing the step of computing the distance between the magnetic field source and the magnetic field sensor at least two times at a predetermined time interval; compute the travel of said magnetic field source within the predetermined time interval; computing the speed of the magnetic field source relative to the magnetic field sensor from the travel and time.

It is achieved a system which determines the speed of a passing pig.

The method may also comprise the steps of: moving the magnetic field sensor in a longitudinal direction of the pipe; identifying a position along the pipe in which the measured magnetic field data indicate the presence of a magnetic field source.

It is achieved a system for locating a pig in a pipe.

The method may also comprise the steps of: maintaining the magnetic field sensor at a given position on the pipe; identifying measured magnetic field data indicate the passage of a magnetic field source.

It is achieved a system for detection of passage of a pig in a pipe. The system may keep track of the number of pigs passing through the pipe and at which times.

BRIEF DESCRIPTION OF DRAWINGS

The invention will now be described with reference to the exemplifying non-limiting embodiments shown in the accompanying drawings, wherein.

DETAILED DESCRIPTION

Figure 1:
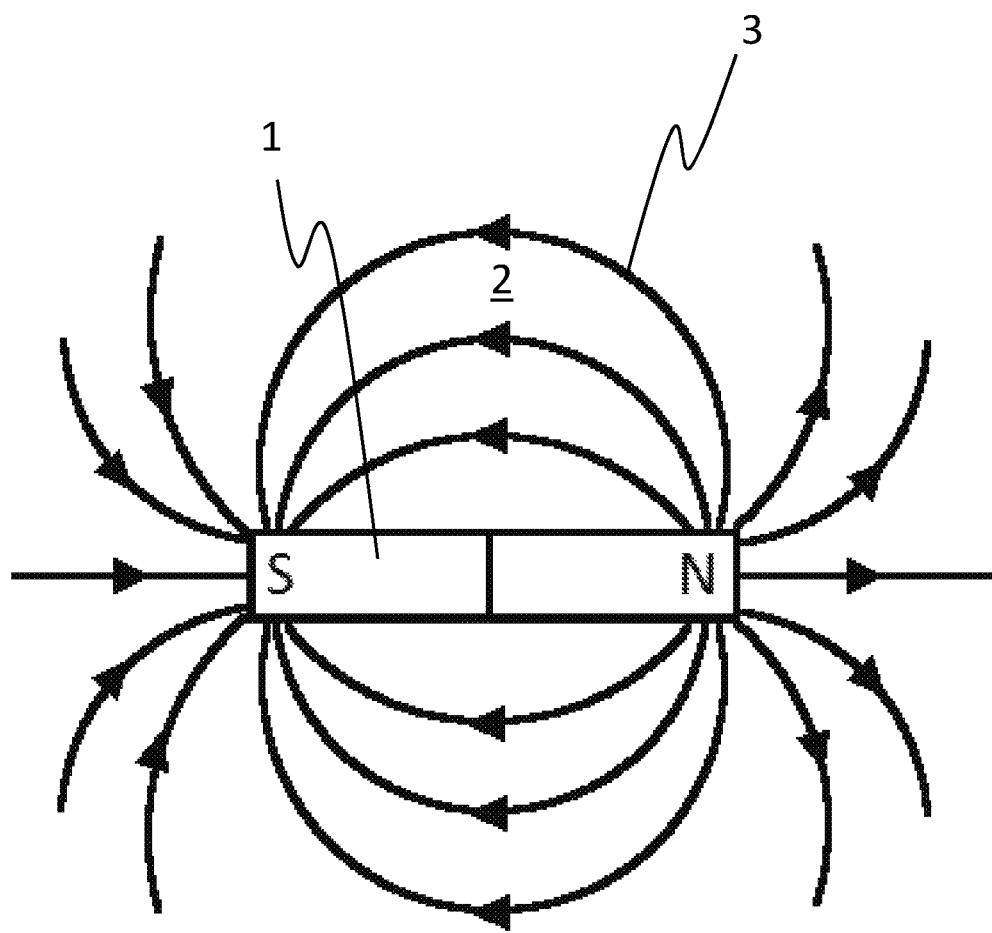
FIG. 1 shows a magnetic field source and its magnetic field.

FIG. 1 shows a magnetic field source 1, in the form of a magnet, providing a magnetic field 2. Magnetic fields are characterized by magnetic field lines 3. Magnetic field lines 3 are continuous curves in a magnetic field 2 such that a tangent at any point of them gives the direction of the magnetic field 2 at that point. Outside of the magnet, the magnetic field lines 3 are directed from the north pole of the magnet towards the south pole of the magnet and they never intersect one another. As a magnetic field 2 gets weaker, the distance between the magnetic field lines 3 increases.

In physics, a magnetic field is described by the magnetic flux density, also known as magnetic induction, B, which is a vector pointing in the magnetic field direction and of magnitude corresponding to the magnetic field strength.

Figure 2:
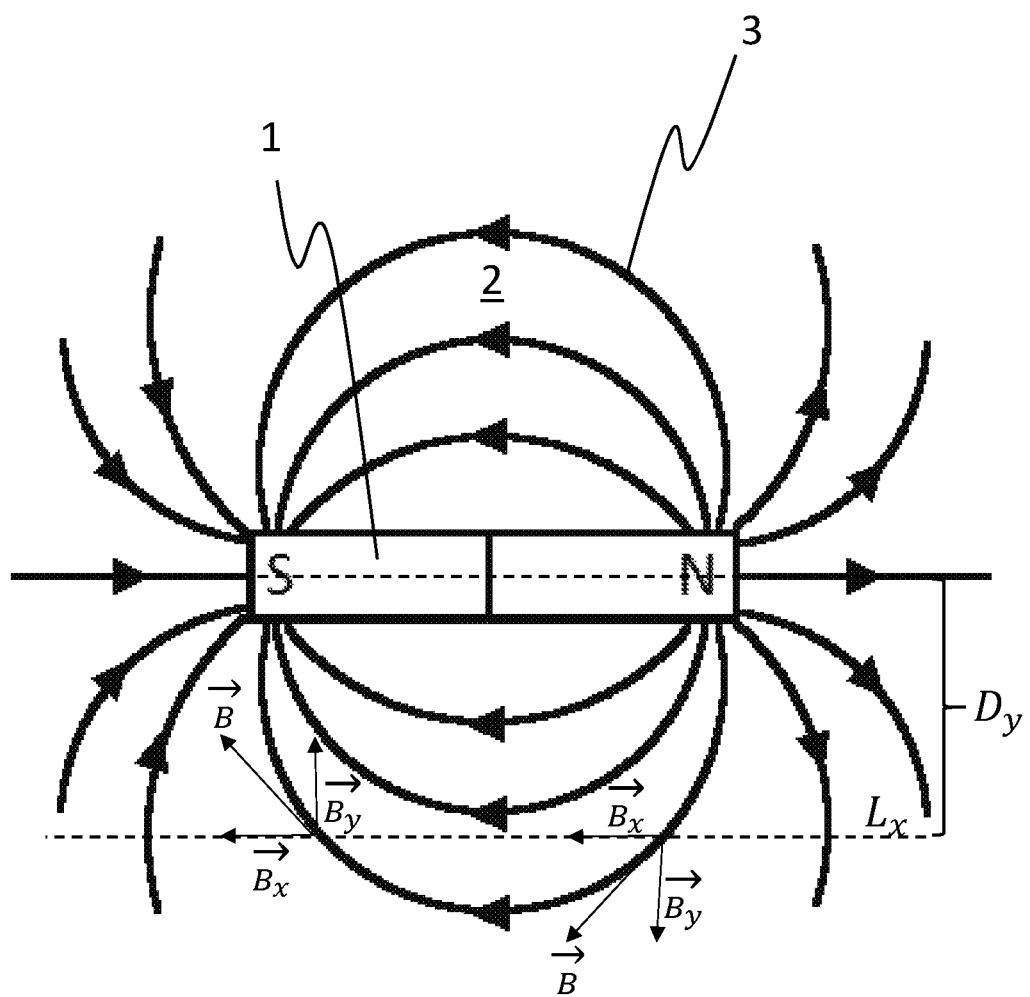
FIG. 2 shows how a magnetic field may be decomposed.

FIG. 2 shows how the vector B can be decomposed to an x-component $B_x$ parallel to the S-N orientation of the magnetic field source 1 and an y-component $B_y$ perpendicular to the South-North (S-N) orientation of the magnetic field source 1. An imaginary line $L_x$ is parallel to the S-N orientation of the magnetic field source 1. The imaginary line $L_x$ is offset the magnetic field source 1 with a distance $D_y$. $B_x$ and $B_y$ are located on the imaginary line $L_x$.

Figure 3:
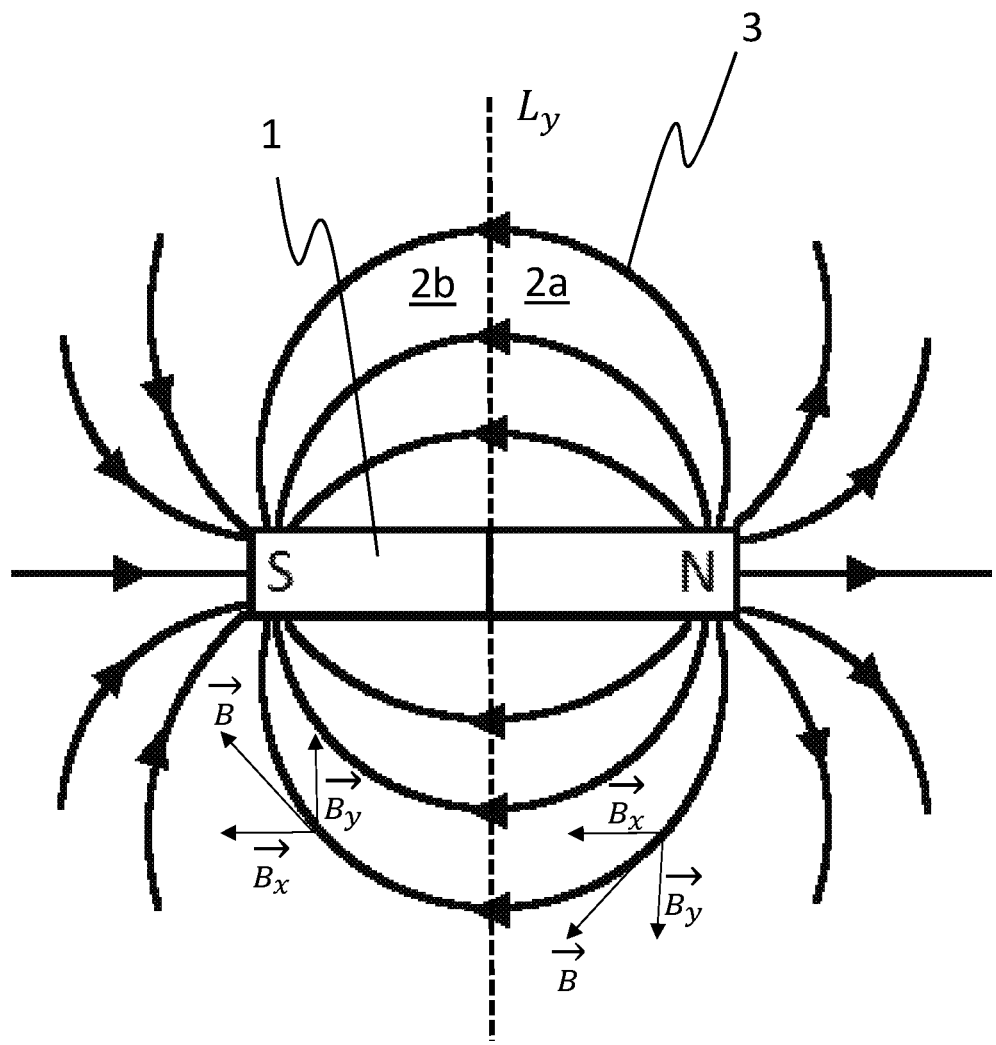
FIG. 3 shows how a magnetic field may be divided into a south side and a north side on opposite sides of a neutral line.

FIG. 3 shows an imaginary line $L_y$ perpendicularly intersecting the neutral line of the magnetic field source 1, with the north pole on one side and the south pole on the opposite side, the magnetic field 2 is divided into a north side 2a and a south side 2b.

When looking at the north side 2a of the magnetic field, all y-components $B_y$ will point away from the magnetic field source 1. When looking at the south side 2b of the magnetic field, all y-components $B_y$ will point towards the magnetic field source 1.

Figure 4:
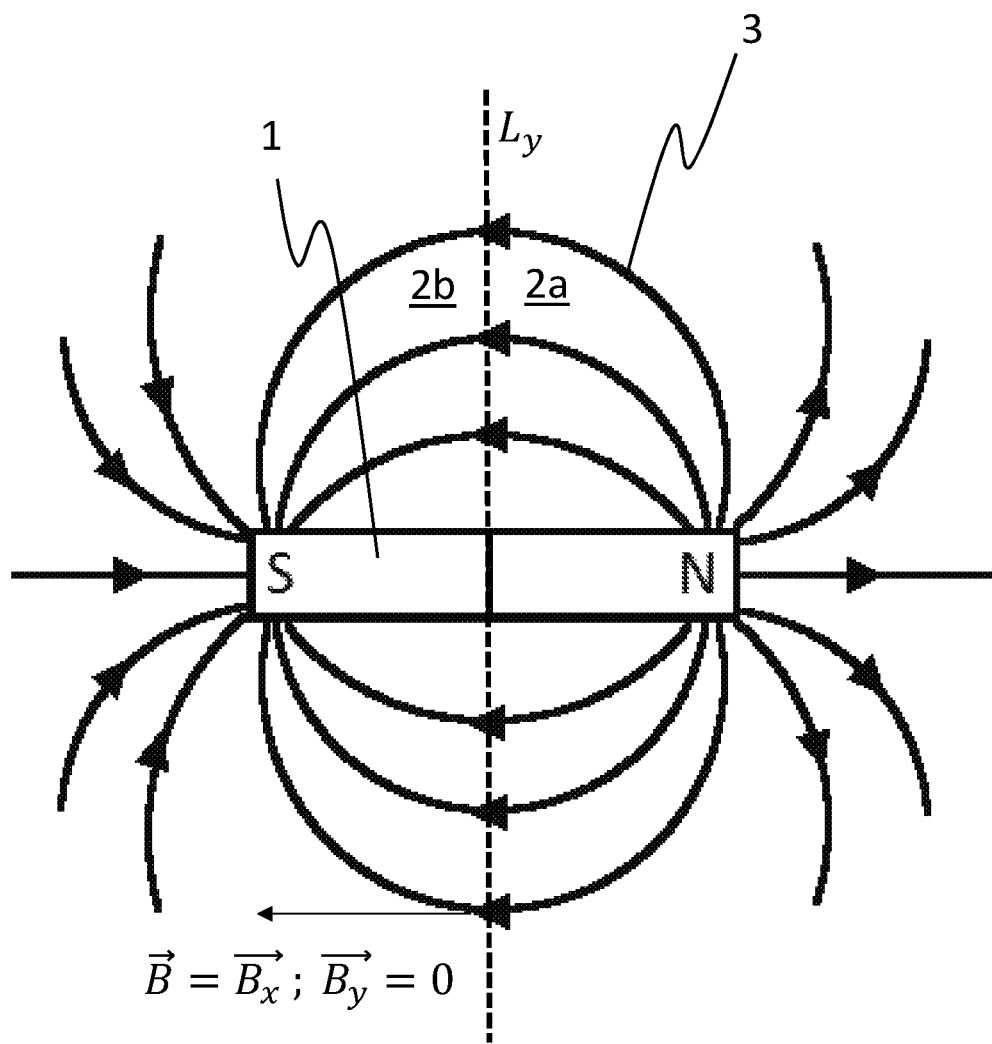
FIG. 4 shows how a magnetic field may be decomposed.

FIG. 4 shows the same magnetic field 2a, 2b and the same imaginary line $L_y$ as FIG. 3. Along the imaginary line $L_y$, any vector B will have no y-component $B_y$. Thus, any vector B along the imaginary line equals its own x-component $B_x$.

Figure 5:
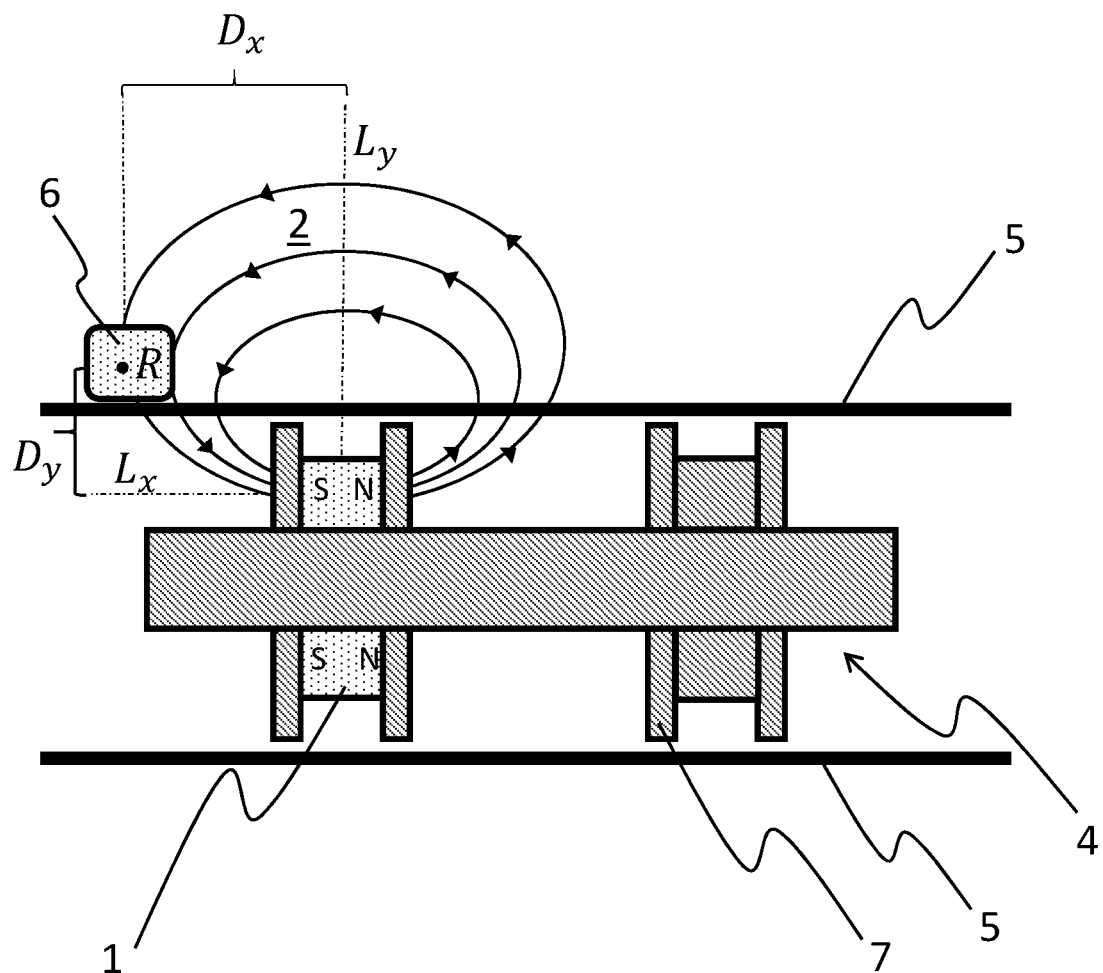
FIG. 5 shows an operational setup of the invention.

FIG. 5 shows a pipeline inspection gauge 4 (PIG) inside a pipe 5. The pig 4 is provided with a magnetic field source 1 creating a magnetic field 2 which extends to the outside of the pipe 5. The magnetic field source 1 is positioned at a source position. On the outside of the pipe 5, a magnetic field sensor 6 is arranged and adapted to measure the magnetic field 2 provided by the magnetic field source 1.

The magnetic field sensor 6 may comprise a sensing element, for example 2- or 3-dimensional magnetometer, and supporting electronic circuits for reading sensor data and transferring data to a connected host. A plurality of magnetic field sensors 6 can be used.

Pigs 4 per se are considered known to those skilled in the art and will therefore not be described in detail.

In the embodiment illustrated in FIG. 5, the magnetic field source 1 is a plurality of permanent magnets. Specifically, rectangular (alternatively circular) bar magnets which are axially magnetized and circumferentially arranged on the pig 4.

The bar magnets arranged on the pig 4 are positioned between a pair of cleaning discs 7. In this case the magnets may take the place of a cleaning disc spacer. The length of the bar magnets should then be adapted to the desired distance between the cleaning discs 7. One or several disc magnets could alternatively be used in a similar way as the above-mentioned bar magnets. The disc magnets would require an inner diameter equal to the body of the pig 4 and an outer diameter adapted to the size of the pipe 5. The thickness and number of disc magnets should then be adapted to the desired distance between the cleaning discs 7.

Alternatively, at least a part of the body of the pig 4 may be a circular bar magnet and thus serve as the magnetic field source 1.

The magnetic field source 1 may be chosen from the group consisting of permanent magnets, temporary magnets, electromagnets or any combination thereof. To form the magnetic field source 1, a plurality of said sources may be used. The number of sources may be adjusted in order to provide the desired magnetic flux density. When using a plurality of sources, all sources are preferably aligned in the same direction with regard to the magnetic field 2 they provide.

Independently of the number or type of magnetic field sources 1, the S-N orientation of the magnetic field source 1 is preferably oriented in parallel with the longitudinal direction of the pipe 5, as shown in FIG. 5. However, other orientations may also be used.

When several magnetic field sources 1 are used, they should preferably be located at the same distance from the pipe 5.

Any type of permanent magnets (Neodymium Iron Boron, Samarium Cobalt, Alnico, Ceramic or Feritte) may be used. Permanent magnets have the advantage of not easily losing their magnetism which makes them durable and robust during operation. Furthermore, they may provide a magnetic field 2 strong enough to reach the outside of a surrounding pipe 5.

Some iron and iron alloys can be easily magnetized to serve as temporary magnet. Temporary magnets may be used in the present invention but are not ideal due to their gradual loss of magnetism. The body of the pig 4, the cleaning discs 7 or cleaning disc spacers may by adapted to serve as temporary magnets.

If a strong magnetic field is required, the pig 4 may be provided with an electromagnet. By manufacturing at least part of the pig 4 in metal or providing it with a metal core, a wire suitable for carrying an electric current may be coiled around the metal part to form an electromagnet. An electric source, such as a battery, suitable for powering the electromagnet may also be provided as part of the pig 4.

In FIG. 5, the imaginary line $L_y$ intersects the neutral line of the magnetic source 1. The imaginary line $L_y$ also intersects the center of the magnetic field 2. The longitudinal distance $D_x$ defines the distance between the measuring position of the magnetic field sensor 6 and the neutral line of the magnetic field source 1. The longitudinal distance $D_x$ also defines the distance between the measuring position of the magnetic field sensor 6 and center of the magnetic field 2, i.e. the distance between the pig 4 and the magnetic field sensor 6.

In FIG. 5, the imaginary line $L_x$ intersects the center of the magnetic source 1. The radial distance $D_y$ defines the distance between the measuring position of the magnetic field sensor 6 and the center of the magnetic field source 1, i.e. the source position.

$D_y$ will be close to constant for a given combination of pipe 5 and pig 4. $D_y$ is easily available and may be used as input data.

$D_x$ is the unknown distance of interest. $D_x$ may be computed by a processor configured to receive magnetic field data from the magnetic field sensor 6. Relevant input to the processor for computing the distance $D_x$ may be one or several of:

distance $D_y$, magnetic field parameters measured by the magnetic field sensor 6, data on the magnetic field 2 provided by the magnetic field source 1, magnetic field source 1 data, e.g. size, type and strength, magnetic field representation of the magnetic field 2 provided by the magnetic field source 1, magnetic background noise, pipe 5 data, e.g. diameter, wall thickness and material, the distortional effect a relevant pipe 5 has on the magnetic field 2 provided by a relevant magnetic field source 1, a register of measurable magnetic field data and corresponding distance $D_x$ values, alternatively also corresponding pipe 5 data, and magnetic field sensor 6 geometrical position and orientation to the Earth magnetic poles.

The source position of the magnetic field source 1 can be determined relative to a reference position R. The measuring position of the magnetic field sensor 6 must then also be considered relative to the reference position R.

The reference position can be positioned at any given position. However, it could be advantageous to coincide the measuring position of the magnetic field sensor 6 and the reference position. An alternative position of the reference position R is along the imaginary line $L_x$.

Figure 6:
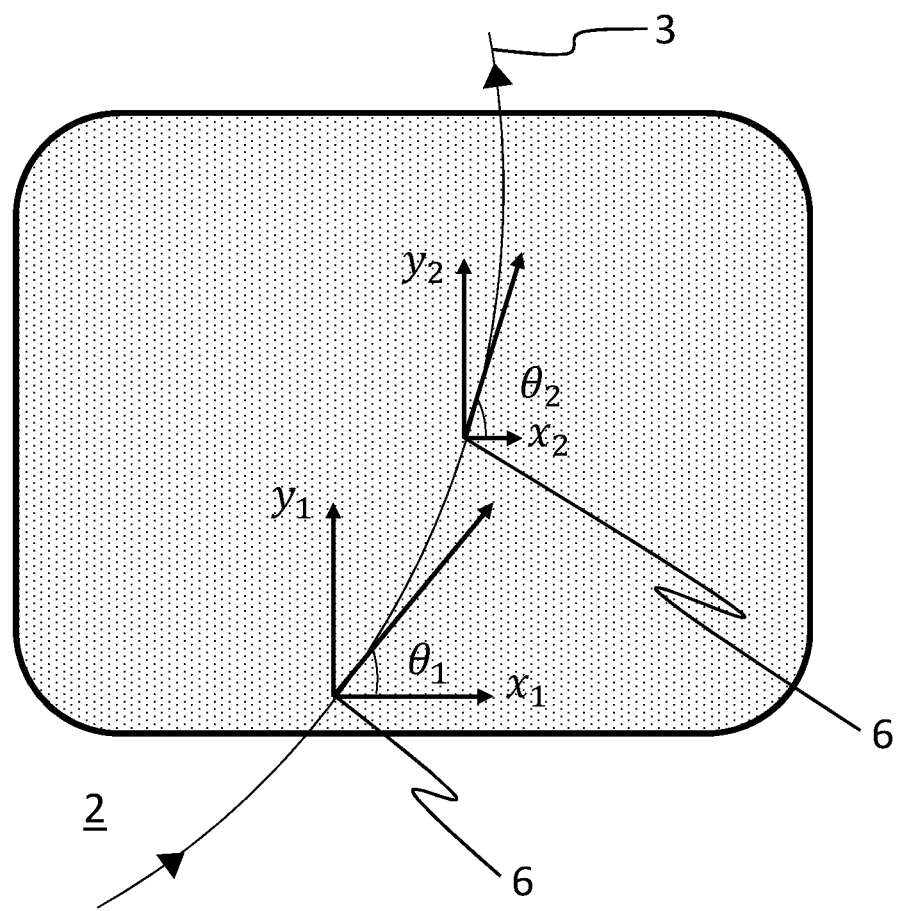
FIG. 6 shows how a magnetic field may be decomposed.

FIG. 6 shows an example of how magnetic field data may be measured by means of a plurality of magnetic field sensors 6 within the same sensor unit. Alternatively, but not shown, may a plurality of magnetic field sensors 6 in separate sensor units be adjacently positioned for the same purpose. Alternatively, but not shown, may a plurality of magnetic field sensors 6 in separate sensor units be spaced apart.

In FIG. 6 the magnetic field lines 3 intersecting the sensor unit containing a plurality of magnetic field sensors 6 may be measured at one or several places within the sensor unit, e.g. at each side, at the top and bottom, at each corner or selected positions within the sensor unit.

By a first magnetic field sensor 6, a first radial component $y_1$ of the magnetic field 2 in a radial direction of the pipe 5 may be measured. By the same magnetic field sensor 6, a first longitudinal component $x_1$ of the magnetic field 2 in a longitudinal direction of the pipe 5 may be measured. From these two measured components $x_1$, $y_1$, a first angle $\theta_1$ may be computed by means of trigonometry. $\theta_1$ indicates the direction of the magnetic field 2 at this specific point, i.e. the direction of B at this specific point as illustrated in FIG. 2.

By a second magnetic field sensor 6, located at a different position than the first magnetic field sensor 6, a second radial component $y_2$ of the magnetic field 2 in a radial direction of the pipe 5 may be measured. By the same magnetic field sensor 6, a second longitudinal component $x_2$ of the magnetic field 2 in a longitudinal direction of the pipe 5 may be measured. From these two measured components $x_1$, $y_1$, a second angle $\theta_2$ may be computed by means of trigonometry. $\theta_2$ indicates the direction of the magnetic field 2 at this specific point, i.e. the direction of B at this specific point as illustrated in FIG. 2.

When a radial component y of the magnetic field 2 provided by the magnetic field source 1 is measured by the magnetic sensor 6 to be about zero, as seen in FIG. 4, the magnetic field sensor 6 is aligned with the magnetic field source 1. I.e. the pig 4 is aligned with the magnetic field sensor 6. It follows that when the measured radial component y of the magnetic field 2 provided by the magnetic field source 1 is measured by the magnetic sensor 6 deviates from zero, the magnetic field source 1 deviates from the magnetic field sensor 6. I.e. the pig 4 deviates from the magnetic field sensor 6.

When a radial component y of the magnetic field 2 provided by the magnetic field source 1 is measured to point away from the pipe 5, as seen in FIG. 3, the magnetic field sensor 6 is located on the north side 2a of the magnetic field 2. When a radial component y of the magnetic field 2 provided by the magnetic field source 1 is measured to point towards the pipe 5, as seen in FIG. 3, the magnetic field sensor 6 is located on the south side 2b of the magnetic field 2.

Experiments may be conducted in a suitable environment to establish a set of data containing information on magnetic field data and corresponding distances between a magnetic field source 1 and a magnetic field sensor 6. Other parameters to consider is $D_y$, the wall thickness of the pipe 5 and the material of the pipe 5. At a later stage, the distance $D_x$ between the magnetic field source 1 on a pig 4 in operation and the provided magnetic field sensor 6 may later be computed by means of comparing the magnetic field data measured by the magnetic field sensor 6 with a relevant data set. For this method to give the most reliable results, the magnetic field source 1 and the magnetic field sensor 6 used during the experiment should also be used during operation. Alternatively, a magnetic field source 1 and a magnetic field sensor 6 being as similar as possible should be used. The other parameters ($D_y$, the wall thickness of the pipe 5 and the material of the pipe 5) must be equal or at least similar to those from the experiment in order to compute a reliable distance $D_x$.

An approximate model of a magnetic field line 3 of the magnetic field 2 provided by the magnetic field source 1 may be computed from the following parameters: two computed angles $\theta_1$, $\theta_2$ of the magnetic field 2 at two different points, the distance between these two points and the radial distance $D_y$ from the magnetic field source 1 to these two points. The field lines 3 of the magnetic field 2 typically have elliptic geometry.

Instead of computing a model of the magnetic field 2 from the magnetic field source 1 by means of measured magnetic field data, a first principles model of the magnetic field 2 may be computed. This first principles model of the magnetic field 2 is preferably based on the type and size of the magnetic field source 1. The first principles model of the magnetic field 2 has its origin in the magnetic field source 1. A magnetic field representation of the magnetic field 2 provided by the magnetic field source 1 established by a first principles model will not include magnetic background noise.

With an approximate or first principles model of the magnetic field 2 by at least one field line 3, as described above, it is possible to compute the approximate location of the magnetic field sensor 6 on the periphery of the magnetic field line 3 based on the measured field parameters, i.e. the measured longitudinal component x and the measured radial component y or the at least one computed angle θ. The radial distance $D_y$ between the magnetic field source 1 and the magnetic field sensor 6 being known or alternatively derivable from geometric data of the pig 4 and pipe 5. The distance $D_x$ between the magnetic field sensor 6 and the magnetic field source 1 may then be computed based on the approximate or first principles model of the magnetic field 2 and the approximate location of the magnetic field sensor 6 on the periphery of the magnetic field line 3. The imaginary line $L_y$ which intersects the neutral line of the magnetic field source 1 also intersects the center of the magnetic field 2, as illustrated in FIG. 5. A computed distance $D_x$ between the magnetic field sensor 6 and the center of the magnetic field 2 will equal the distance $D_x$ between the magnetic field sensor 6 and the magnetic field source 1.

The system used to determine the position of a pig 4 located inside a pipe 5 comprises the magnetic field source 1 attached to the pig 4, at least one magnetic field sensor 6 provided on the outside of the pipe 5 and configured to measure magnetic field parameters, and a processor configured to receive magnetic field parameters from the at least one magnetic field sensor 6 and computing a position of the magnetic field source 1 relative to a given reference position.

This system will compute the position of the magnetic field source 1 relative to the reference position based on data comprising the in-situ measured magnetic field parameters and the magnetic field representation of the magnetic field 2 provided by the magnetic field source 1, and outputting data on the source position of the magnetic field source 1 relative to the reference position.

The magnetic field representation of the magnetic field provided by the magnetic field source may inter alia be functions, regression calculation models, statically calculation models, math models, tables, and machine learning. Furthermore, it may be provided as a first principles model. Alternatively, the magnetic field representation may be provided by actual measurements of a similar magnetic field set up in a laboratory.

A magnetic field representation of the magnetic field provided by actual measurements will include the distortional effect the pipe 5 has on the magnetic field provided by the magnetic field source 1. A magnetic field representation of the magnetic field theoretically provided will not include the distortional effect the pipe 5 has on the magnetic field provided by the magnetic field source 1. The magnetic field representation of the magnetic field provided by actual measurements thus has an advantage compared to the magnetic field representation of the magnetic field theoretically provided. An advantage of the theoretically provided magnetic field representation compared to the magnetic field representation provided by actual measurements is that is doesn't include any magnetic background noise. A person skilled in the art will based on the knowledge of these effect be able to select the best approach for each specific case and make use of the advantages of the invention.

In-situ measurements are performed with the magnetic field sensor 6 positioned at least at one given measuring position relative to the reference position. The magnetic field sensor 6 measures at least two magnetic field parameters on the outside of the pipe 5.

The step of providing a magnetic field representation by actual measurements may comprise the sub-steps of: arranging the pipe 5 at a given pipe position relative to the reference position, positioning the magnetic field source 1 at a given source position relative to the reference position, wherein the source position is located inside the pipe 5, measuring at least two magnetic field parameters of the magnetic field 2 provided by the magnetic field source 1 by means of the at least one magnetic field sensor (6) at a given measuring positions relative to the reference position, wherein the measuring positions is located outside the pipe 5, storing the measured magnetic field parameters of the magnetic field 2 provided by the magnetic field source 1 and the corresponding measuring position relative to the reference position, repeating the preceding steps at least once either with the magnetic field source 1 moved to at least one subsequent given source position or with the magnetic field sensor 6 moved to at least one subsequent given measuring position, and establishing the magnetic field representation of the magnetic field 2 provided by the magnetic field source 1 based on the stored magnetic field parameters of the magnetic field 2 provided by the magnetic field source 1 and their measuring positions relative to the reference position.

The magnetic field representation obtained by actual measurements includes magnetic background noise. By also measuring the magnetic background noise, i.e. the same measurements without the presence of the magnetic field source 1, the magnetic field representation obtained by actual measurements can be compensated for this magnetic background noise.

The magnetic background noise may comprise the Earth's magnetic field, or any other magnetic fields distortions present within the measuring range of the magnetic field sensor 6. The magnetic background noise may substantially not comprise the magnetic field provided by the magnetic field source 1.

The magnetic field source 1 is therefore kept out of reach, i.e. being magnetically insulated or outside a significant measuring range of the magnetic field sensor 6 while the magnetic background noise is measured.

The step of calibrating the magnetic field representation comprises the following sub-steps: arranging the pipe 5 at a given pipe position relative to the reference position; ensuring the magnetic field source 1 is out of reach of the at least one magnetic field sensor 6; measuring two magnetic field parameters of a reference magnetic background noise by means of the at least one magnetic sensor (6) at least at one given measuring positions relative to the reference position, wherein the at least one given measuring position is located outside the pipe 5; storing the measured magnetic field parameters of the reference magnetic background noise and their corresponding measuring positions relative to the reference position; and calibrating the magnetic field representation of the magnetic field 2 provided by the magnetic field source 1 by compensating for the reference background noise, wherein the calibration is based on the stored magnetic field parameters of the reference magnetic background noise and their measuring positions relative to the reference position.

Calibrating in-situ magnetic field representation or in-situ measured magnetic field parameters enables a more accurate computation of the position of the magnetic field source 1.

The magnetic background noise is measured to calibrate the in-situ magnetic field representation or in-situ measured magnetic field parameters.

The in-situ calibration being performed prior to computing the position of the magnetic field source 1 relative to the reference position comprises the sub-steps of: ensuring the magnetic field source 1 is out of reach of the at least one magnetic field sensor 6; measuring two magnetic field parameters of in-situ magnetic background noise by means of the at least one magnetic field sensor 6 at the at least one given measuring position relative to the reference position; storing the measured magnetic field parameters of in-situ magnetic background noise and their corresponding measuring positions relative to the reference position; and in-situ calibrating the magnetic field parameters measured in-situ outside the pipe 5 by means of the at least one magnetic field sensor 6 at least at one given measuring position relative to the reference position by compensating for the in-situ background noise, wherein the calibration is based on the stored magnetic field parameters of the in-situ magnetic background noise and their corresponding measuring positions relative to the reference position.

Computing of the magnetic field source position will be more accurate when the magnetic field representation or the in-situ measurements are calibrated. In such cases the computation will compensate for the magnetic background noise.

Figure 7:
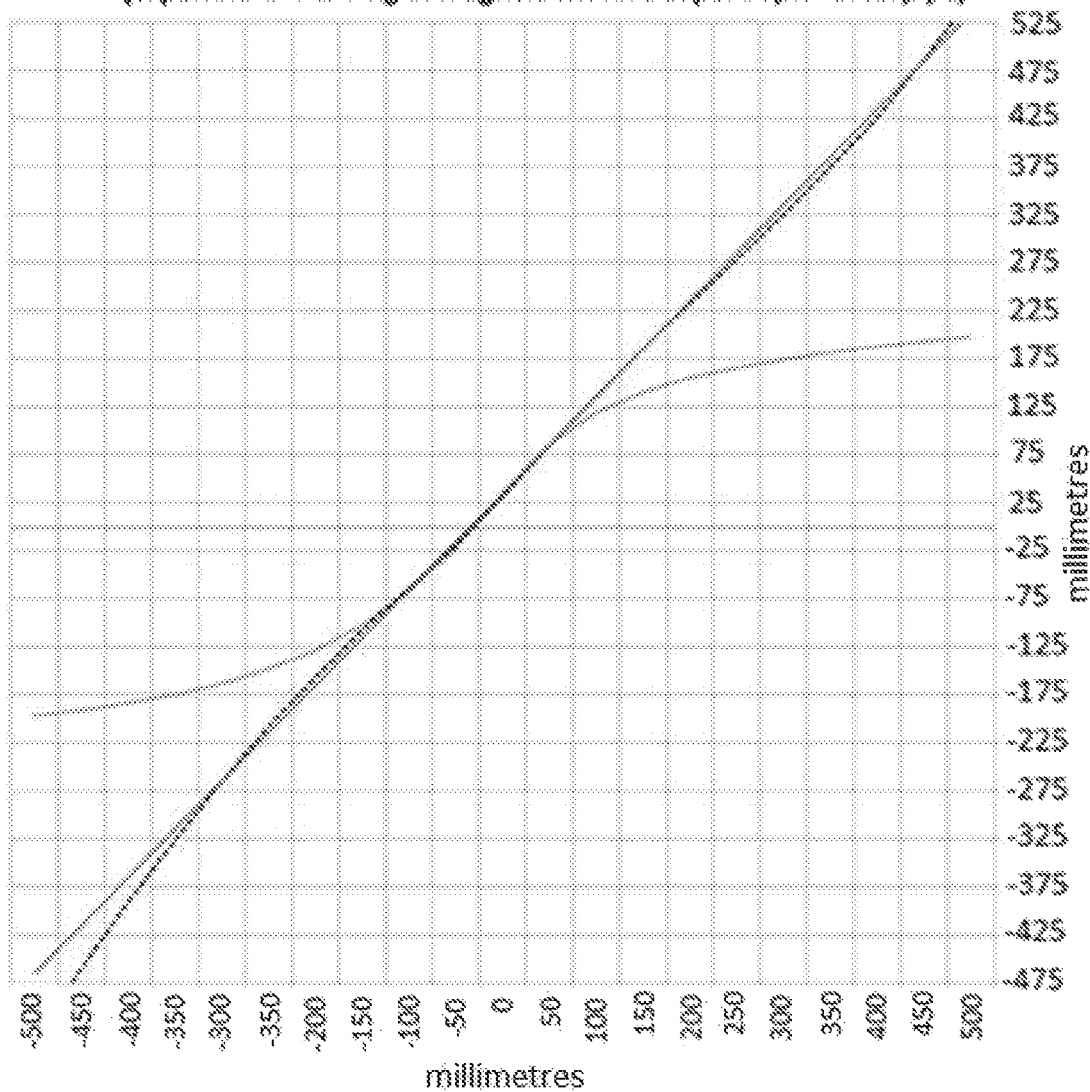
FIG. 7 shows test results illustrating the improvement of the disclosed invention.

FIG. 7 shows the results from an experiment where two pig 4 positioning methods were tested and compared. In this test permanent ring magnets were used as magnetic field source 1 and the pipe 5 was made of super duplex. The first method uses the traditional approximation of the magnetic field 2 from the formula $f(x,y)=S\cdot\theta(x,y)$, as described in the background section. The second method, as described in the previous paragraph, uses traditional magnetic theory (such as first principles magnetic field models) to model a more precise approximation of the magnetic field 2 provided by the magnetic field source 1, and then compute the linear position of the magnetic field source 1 from this model. Three graphs are plotted in the coordinate system of FIG. 7. Results from the first and traditional method are represented by the graph "POS_arctan". Results from the second and inventive method are represented by the graph "POS_new". The true position of the pig 4 is represented by the graph "true position".

FIG. 7 shows that the new method greatly increases the position measurement range for a pig 4 supplied with a magnetic field source 1 inside a pipe 5 made of super duplex. For a pipe 5 of carbon steel, which is the most common material for oil & gas pipes, experiments have shown that the measurement range estimated from the traditional method $f(x,y)=S\cdot\theta(x,y)$ is even more limited. This is because carbon steel has a significantly higher magnetic permeability, resulting in much higher magnetic field absorption in the pipe 5 material (reduced field strength outside pipe) and diversion (change of field direction outside pipe).

As can be seen from FIG. 7, the second and inventive method for linear position computation is not prone to the same exponential behavior as the first and traditional computation method. This further increases the practical measurement range, since the reliable range must be restricted by practical signal-to-noise ratio for the application. The second and inventive method has an inherently higher signal-to-noise ratio by being a near exact model of the magnetic field, as opposed to the limited computation using a linear function $f(x,y)=S\cdot\theta(x,y)$.

The disclosed system may be used for monitoring of pigs 4 passing through the pipe 5. The magnetic field sensor 6 may then be placed at a position of the pipe 5 where passage detection is relevant. The magnetic field sensor 6 should preferably be keep at the given position during the entire passage detection. By means of the magnetic field data measured by the magnetic field sensor 6, passage of pigs 4 may be detected. If a moving pig 4 enters the zone of which the magnetic field sensor 6 is capable of measuring, the magnetic field around the magnetic field sensor 6 will change, i.e. the strength of the magnetic field will gradually increase as the pig 4 approaches before gradually decrease as the pig 4 departs. The direction of the measured magnetic field will also change when a pig 4 passes through the pipe 5 at the position of the magnetic field sensor 6.

Identified passages of pigs 4 in the pipe 5 may be logged (time of passage) or counted (number of pigs 4 passing during a given time interval). By providing a given type of magnetic field sources 1 on a given types of pig 4, this type of pig 4 may be identified by means of its type of magnetic field source 1 which provides a characteristic magnetic field 2.

The speed of a passing pig 4 may also be computed. By performing the step of computing the distance $D_x$ between the magnetic field source 1 and the magnetic field sensor 6 at least two times, a traveled distance may be computed. If the at least two distance computations are performed at a predetermined or measured time interval, the speed of the pig 4 may be computed based on the traveled distance during the given time interval. The speed may be computed relative to the reference position R.

Furthermore, the acceleration of a pig 4 may be computed. By performing the step of computing the speed of the pig at two given points of time. The acceleration may be computed, preferably relative to the reference position R.

The disclosed system may further be used for locating a pig 4 inside a pipe 5. The magnetic field sensor 6 may then be moved in a longitudinal direction along a portion of the pipe 5 where pig 4 locating is relevant. By means of the magnetic field data measured by the magnetic field sensor 6, the position of a pig 4 may be identified. If a static pig 4 enters the zone of which the moving magnetic field sensor 6 is capable of measuring, the measured magnetic field will change, i.e. the strength of the magnetic field will gradually increase as the magnetic field sensor 6 approaches the pig 4 before gradually decrease as the magnetic field sensor 6 departs. The direction of the measured magnetic field will also change when the magnetic field sensor 6 passes a pig 4. Furthermore, in a similar manner, the disclosed system may be used to determine if a pig 4 is present in a relevant portion of a pipe 5. By providing different types of magnetic field sources 1 on different types of pigs 4, the type of pig 4 located may be identified by the system.

The position or passage detection computation may be performed by an internal processor in the magnetic field sensor 6 itself or by an external computing host, such as a PC/laptop or a control system. In the first case the magnetic field sensor 6 may output position and/or passage data to the connected host, while for the latter case the magnetic field sensor 6 may output magnetic field raw data (two or more components of).

The magnetic field sensor 6 may be mounted on the pipe 5 for repeated pig 4 passage detection or position measurements. The magnetic field sensor 6 may be arranged in a hand-held device which can be used for locating a static pig 4 in the pipe 5. A hand-held device may be any device (preferably Ex-approved) supplied with a multi-dimensional magnetic field sensor 6, such as a smart-phone, tablet or watch supplied with a magnetometer.

A computer program (such as a software application designed to run on a hand-held device) may comprise instructions which when the program is executed by a computer cause the computer (or device) to carry out at least parts of the above-mentioned method.

REFERENCE LIST

1—magnetic field source
2—magnetic field
   2a—north side of magnetic field
   2b—south side of magnetic field
3—magnetic field lines
4—PIG (pipeline inspection gauge)
5—pipe
6—magnetic field sensor
7—cleaning disc
B—magnetic field vector
$L_x$—imaginary line, longitudinal
$L_y$—imaginary line, radial
S—south pole of magnetic field source
N—north pole of magnetic field source
$D_x$—distance, longitudinal
$D_y$—distance, radial
θ—angle of magnetic field
x—longitudinal component
y—radial component

The invention claimed is:

1. A method for determining the position of a pig located inside a pipe, using a system comprising:
   a magnetic field source attached to the pig;
   at least one magnetic field sensor provided on the outside of the pipe and configured to measure magnetic field parameters; and
   a processor configured to receive magnetic field parameters from the at least one magnetic field sensor and computing a position of the magnetic field source relative to a given reference position;
wherein the method comprises the steps of:
   establishing a magnetic field representation of the magnetic field provided by the magnetic field source, wherein the step of establishing the magnetic field representation of the magnetic field provided by the magnetic field source comprises the steps of:
     arranging the pipe at a given pipe position relative to the reference position;
     positioning the magnetic field source at a given source position relative to the reference position, wherein the source position is located inside the pipe;
     measuring at least two magnetic field parameters of the magnetic field provided by the magnetic field source by means of the at least one magnetic field sensor at a given measuring position relative to the reference position, wherein the measuring position is located outside the pipe;
     storing the measured magnetic field parameters of the magnetic field provided by the magnetic field source and the corresponding measuring position relative to the reference position;
     repeating the preceding steps at least once either with the magnetic field source moved to at least one subsequent given source position or with the magnetic field sensor moved to at least one subsequent given measuring position; and establishing the magnetic field representation of the magnetic field provided by the magnetic field source based on the stored magnetic field parameters of the magnetic field provided by the magnetic field source and their corresponding measuring positions relative to the reference position;

in-situ measuring at least two magnetic field parameters outside the pipe by means of the at least one magnetic field sensor at least at one given measuring position relative to the reference position;

computing the source position of the magnetic field source relative to the reference position based on data comprising the in-situ measured magnetic field parameters and the magnetic field representation of the magnetic field provided by the magnetic field source; and outputting data on the source position of the magnetic field source relative to the reference position.

2. The method according to claim 1,
wherein two or more types of pigs are provided, wherein each type of pig is provided with a given type of magnetic field source and the given type of magnetic field source provides a characteristic magnetic field;
wherein the method further comprises the steps of:
establishing a register of types of pigs and corresponding characteristic magnetic fields;
computing the type of pig based on data comprising the in-situ measured magnetic field parameters and the register of types of pigs and corresponding characteristic magnetic field; and
outputting data on the type of pig.

3. The method according to claim 1,
wherein the magnetic field parameters are vector components, e.g. magnitude and a direction angle or components in a coordinate system.

4. The method according to claim 1,
wherein the measuring position of the magnetic field sensor coincide with the reference position.

5. The method according to claim 1,
wherein the magnetic field representation of the magnetic field provided by the magnetic field source is a magnetic field law model.

6. The method according to claim 1, wherein the step of establishing the magnetic field representation of the magnetic field provided by the magnetic field source further comprises the steps of:
arranging the pipe at a given pipe position relative to the reference position;
ensuring the magnetic field source is out of reach of the at least one magnetic field sensor;
measuring two magnetic field parameters of a reference magnetic background noise by means of the at least one magnetic field sensor at least at one given measuring position relative to the reference position, wherein the at least one given measuring position is located outside the pipe;
storing the measured magnetic field parameters of the reference magnetic background noise and the corresponding measuring position relative to the reference position; and
calibrating the magnetic field representation of the magnetic field provided by the magnetic field source by compensating for the reference background noise, wherein the calibration is based on the stored magnetic field parameters of the reference magnetic background noise and the corresponding measuring position relative to the reference position.

7. The method according to claim 1,
wherein the method further comprises the step of in-situ calibrating the magnetic field parameters measured in-situ outside the pipe by means of the at least one magnetic field sensor at least at one given measuring position relative to the reference position, the in-situ calibration being performed prior to computing the position of the magnetic field source relative to the reference position;
wherein the in-situ calibrating comprises the steps of:
ensuring the magnetic field source is out of reach of the at least one magnetic field sensor;
measuring two magnetic field parameters of in-situ magnetic background noise by means of the at least one magnetic field sensor at the at least one given measuring position relative to the reference position;
storing the measured magnetic field parameters of in-situ magnetic background noise and their corresponding measuring position relative to the reference position; and
in-situ calibrating the magnetic field parameters measured in-situ outside the pipe by means of the at least one magnetic field sensor at least at one given measuring position relative to the reference position by compensating for the in-situ background noise,
wherein the calibration is based on the stored magnetic field parameters of the in-situ magnetic background noise and the corresponding measuring position relative to the reference position.

8. The method according to claim 7,
wherein the method further comprises the step of in-situ re-calibrating the magnetic field parameters measured in-situ outside the pipe by means of the at least one magnetic field sensor at least at one given measuring position relative to the reference position, the in-situ re-calibration being performed after the pig has passed by in the pipe,
wherein the re-calibration comprises the step of:
repeating the steps of the in-situ calibration.

9. The method according to claim 1,
wherein the computed position of the magnetic field source relative to the reference position is within a distance range of ±500 cm, preferably ±200 cm, more preferably ±150 cm, even more preferably ±15 cm in the longitudinal direction of the pipe.

10. The method according to claim 1,
wherein the method further comprises the step of computing a velocity of the magnetic field source,
wherein the computing of the velocity of the magnetic field source comprises the steps of:
performing, at least two times at given points of time, the step of computing the position of the magnetic field source relative to the reference;
computing the traveled distance of the magnetic field source based on the computed positions of the magnetic field source relative to the reference position;
computing the velocity of the magnetic field source relative to the reference position based on the traveled distance and the given points of time; and
outputting data on the velocity of the magnetic field source relative to the reference position.

11. The method according to claim 10,
wherein the method further comprises the step of computing an acceleration of the magnetic field source,
wherein the computing of the acceleration of the magnetic field source comprises the steps of:

computing, at least two times at given points of time, the velocity of the magnetic field source relative to the reference;

computing the acceleration of the magnetic field source relative to the reference position based on the velocities and the given points of time; and outputting data on the velocity of the magnetic field source relative to the reference position.

12. A non-transitory computer readable medium comprising instructions which, when the program is executed by a computer, cause the computer to carry out the method according to claim 1.

13. A system for determining the position of a pig located inside a pipe, wherein the system comprises:

a magnetic field source attachable to the pig;

a magnetic field sensor deployable on the outside of the pipe and configured to measure magnetic field parameters; and a processor configured to receive magnetic field parameters from the magnetic field sensor;

wherein the processor comprises means for computing the position of the magnetic field source relative to a reference position by performing the method of claim 1.

14. The system according to claim 13, wherein the processor and the magnetic field sensor are integrated in a portable sensor unit.

* * * * *